(12) United States Patent  (10) Patent No.: US 9,197,214 B2
Nazemi et al.  (45) Date of Patent: Nov. 24, 2015

(54) HIGH SPEED LEVEL SHIFTER WITH AMPLITUDE SERVO LOOP

(71) Applicant: Broadcom Corporation, Irvine, CA (US)

(72) Inventors: Ali Nazemi, Aliso Viejo, CA (US); Kangmin Hu, Irvine, CA (US); Jun Cao, Irvine, CA (US); Afshin Doctor Momtaz, Laguna Hills, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 14/025,058

(22) Filed: Sep. 12, 2013

(65) Prior Publication Data

US 2015/0035563 A1  Feb. 5, 2015

Related U.S. Application Data

(60) Provisional application No. 61/859,936, filed on Jul. 30, 2013.

(51) Int. Cl.
*H03K 19/0175* (2006.01)
*H03K 19/0185* (2006.01)

(52) U.S. Cl.
CPC .............. *H03K 19/018507* (2013.01)

(58) Field of Classification Search
CPC ............... H03K 3/356113; H03K 19/018521; H03K 19/018528; H03K 19/00315
USPC ........................ 326/63, 68, 80–83
See application file for complete search history.

(56) References Cited

U.S. PATENT DOCUMENTS

| | | | | |
|---|---|---|---|---|
| 6,323,683 B1 * | 11/2001 | Katikaneni | | 326/66 |
| 6,504,405 B1 * | 1/2003 | Nguyen et al. | | 327/67 |
| 6,946,890 B1 * | 9/2005 | Lei et al. | | 327/310 |
| 7,053,657 B1 * | 5/2006 | Peng | | 326/68 |
| 7,180,329 B1 * | 2/2007 | Sia et al. | | 326/81 |
| 7,183,832 B1 * | 2/2007 | Voo | | 327/333 |
| 7,268,588 B2 * | 9/2007 | Sanchez et al. | | 326/68 |
| 7,489,165 B2 * | 2/2009 | Gans | | 327/51 |
| 7,884,646 B1 * | 2/2011 | Bourstein | | 326/81 |
| 8,581,628 B2 * | 11/2013 | Yeh et al. | | 326/82 |
| 8,669,803 B2 * | 3/2014 | Huang et al. | | 327/333 |
| 2006/0226873 A1 * | 10/2006 | De Sandre et al. | | 326/81 |
| 2009/0027102 A1 * | 1/2009 | Fayed | | 327/333 |
| 2011/0069563 A1 * | 3/2011 | Castaldo et al. | | 365/189.11 |
| 2012/0112790 A1 * | 5/2012 | Huang | | 326/81 |
| 2013/0069707 A1 * | 3/2013 | Chaudhry et al. | | 327/333 |

OTHER PUBLICATIONS

Shockman, Paul, Termination and Interface of ON Semiconductor ECL Devices With CML (Current Mode Logic) OUTPUT Structure, Semiconductor Components Industries, LLC, Oct. 2008—Rev. 3, 10 pages.
Holland, Nick, Interfacing Between LVPECL, VML, CML, and LVDS Levels, Texas Instruments, Dec. 2002, 23 pages.

* cited by examiner

*Primary Examiner* — Jason M Crawford
(74) *Attorney, Agent, or Firm* — Brinks Gilson & Lione

(57) ABSTRACT

A high speed level shifter interfaces a high speed DAC to the digital information that the DAC processes. The level shifter may convert CMOS level digital representations to, for example, CML level digital representations for processing by the DAC. The level shifter conserves the voltage swing in the CMOS level representations (e.g., about 1V). The level shifter also avoids voltage overstress, using a feedback loop to constrain the voltage amplitude, and thereby facilitates the use of fast thin film transistors in its architecture.

20 Claims, 5 Drawing Sheets

HIGH SPEED LEVEL SHIFTER WITH AMPLITUDE SERVO LOOP

CROSS REFERENCE TO RELATED APPLICATIONS

This application claims priority to provisional application Ser. No. 61/859,936, filed Jul. 30, 2013, which is incorporated by reference in its entirety.

TECHNICAL FIELD

This disclosure relates to digital voltage level shifters. This disclosure also relates to level shifting digital signals for interfacing to specific processing circuitry, such as digital to analog converters.

BACKGROUND

Rapid advances in electronics and communication technologies, driven by immense customer demand, have resulted in the worldwide adoption of sophisticated electronic devices of every description. In many devices, digital to analog converters (DACs), generate analog signals from digital representations. The digital representations may take different forms and adhere to different conventions, such as CMOS level (0V to 1V) and CML level (0.5v to 1.5V) signals. Improvements in interfacing DACs to the digital representations that the DACs process will help meet high speed conversion goals.

DETAILED DESCRIPTION

Figure 1:
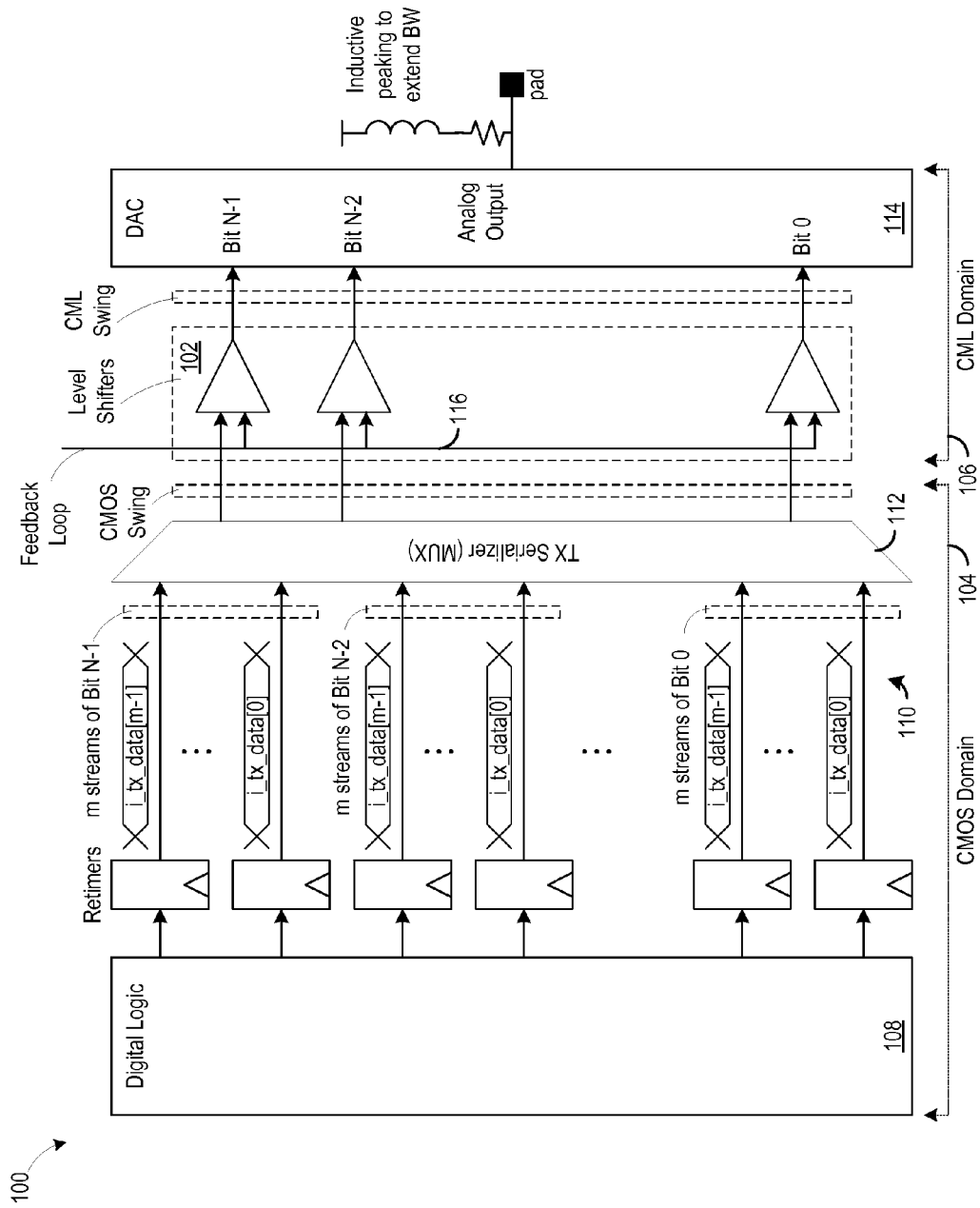
FIG. 1 shows an example of level shifters that interface between logic levels defined according to different conventions.

FIG. 1 shows an example 100 of level shifters 102 that interface between logic levels in different domains defined according to different conventions. The logic levels may be defined as single ended levels or as differential levels. For example, the first domain 104 may adhere to a Complementary Metal Oxide Semiconductor (CMOS) convention in which logic '1' and '0' are defined according to nominal high level and nominal low level voltages or voltage ranges. As a particular example, a CMOS convention may define the difference between logic '1' and '0' as a 1 V swing from 1 V to 0 V. As another example, a second domain 106 may adhere to the Current Mode Logic (CML) convention that defines the difference between logic '1' and '0' as a 1 V swing from 1.5 V to 0.5 V. Other examples of different logic conventions include Transistor-Transistor Logic (TTL), Positive Emitter Coupled Logic (PECL), Low Voltage PECL (LVPECL), Voltage Mode Logic (VML), and Low-voltage Differential Signaling (LVDS). Each convention may have its own definitions of logic '1' and '0', either in a differential sense or single-ended sense.

In the example 100, a digital logic section 108 generates digital bit streams 110. A serializer 112 converts parallel bit streams to a serial streams that are then provided to the Digital to Analog Converter (DAC) 114. First, however, the level shifters 102 translate the logic levels from the first domain 104 to the second domain 106, e.g., from CMOS to CML. The DAC 114 may be a high speed DAC (e.g., 8-bit, 16 Gb/s DAC) that uses a higher power supply (e.g., 1.5 V) than that used in the first domain 104 (e.g., 1.0 V). The higher power supply may call for the shift in levels from the first domain 104 to the second domain 106.

The level shifters 102 translate the voltage level of the digital data signals to a level suitable for the DAC 114. In this instance, the level shifters 102 translate from CMOS level (0 V to 1 V swing) to CML level (0.5 V to 1.5 V swing), while conserving the 1 V swing peak-to-peak. In other implementations, the level shifters 102 may translate data signals, control signals, or any other signals desired (e.g., address signals) for interfacing between any types of logic conventions. Furthermore, the level shifters 102 perform the translation at very high speed using thin oxide transistors and without violating voltage overstress rules. Examples of voltage overstress rules include limits on transistor gate-to-source or gate-to-drain voltages within the level shifter itself, and at the inputs of the DAC 114. The level shifters may operate with voltage amplitude control enforced through a feedback loop 116 that maintains compliant operation across variations in process, voltage, and temperature (PVT).

Figure 2:
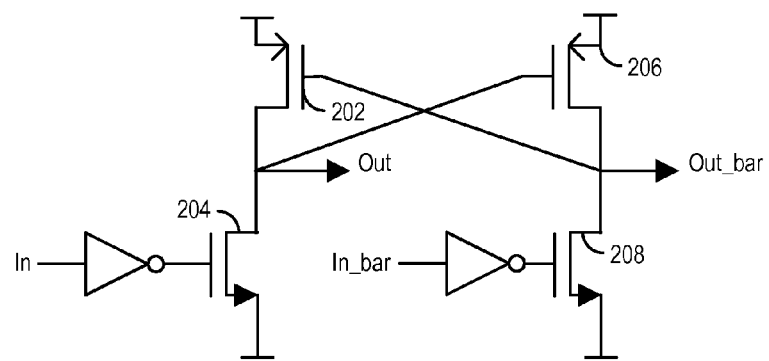
FIG. 2 shows a conventional level shifter.
Figure 3:
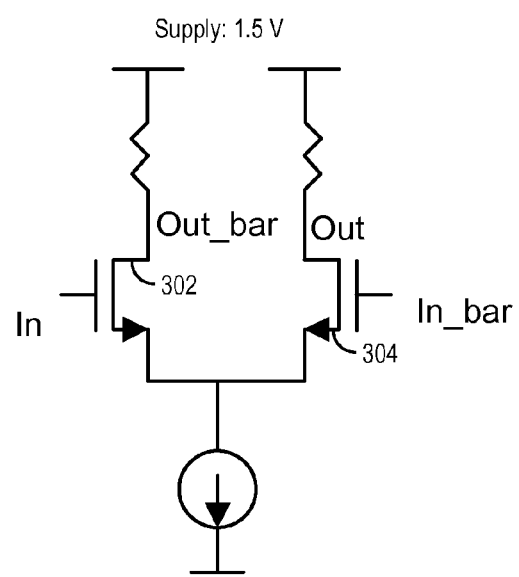
FIG. 3 shows a conventional level shifter.

FIG. 2 shows a conventional level shifter 200 and FIG. 3 shows a conventional level shifter 300. The level shifter 200 uses thick oxide transistors 202, 204, 206, and 208 in order to meet overstress conditions. The thick oxide transistors may slow the operation of the level shifter 200. It may not be possible for the level shifter 200 to meet high speed requirements because it uses thick oxide devices that result in operational speeds that may be much slower (e.g., several orders of magnitude lower) than what can be achieved with thin oxide devices. In the level shifter 300, using thin oxide transistors 302 and 304 will result in violation of voltage overstress conditions, leading to destruction of the thin oxide transistors 302 and 304 in operation.

Figure 4:
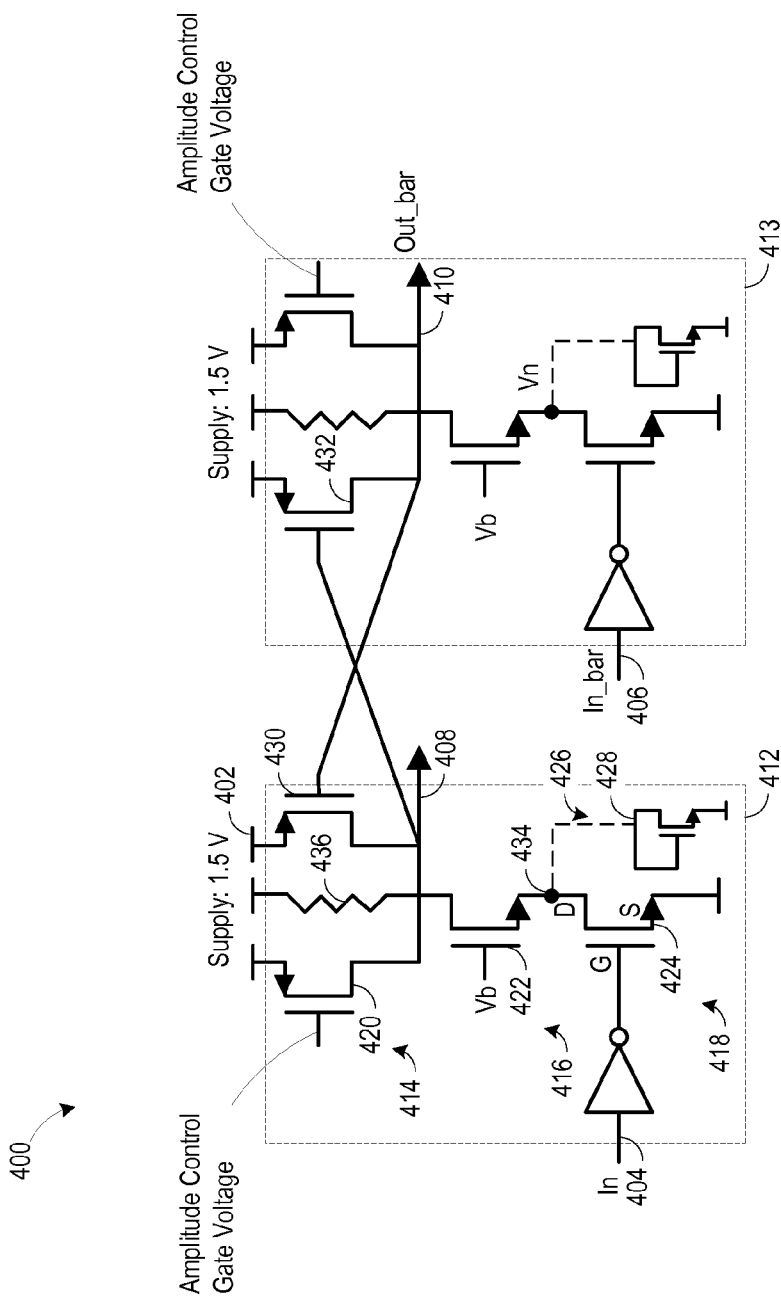
FIG. 4 shows an example of a level shifter with amplitude control and voltage overstress control.

FIG. 4 shows an example of a level shifter 400. The level shifter 400 supports extremely high speed operation, e.g., 16 Gb/s operation. As will be explained below, the level shifter 400 includes an architecture built from thin film transistors that facilitate high speed operation. The thin film transistors are in contrast to thick film transistors that, while able to handle the full supply voltage across the transistors (e.g., 1.5 V Vgs or Vgd), might otherwise limit operational speed, for example to approximately 2 Gb/s or less. The thin film transistors may be fabricated using the latest process technologies, and may therefore achieve the fastest operating speeds. As just one example, the thin oxide devices may be fabricated using a 28 nm (minimum length) process and operate roughly up to 15 Ghz, while thick oxide devices may correspond to a 180 nm process and operate roughly up to 2 Ghz. The thin oxide devices are not limited to any one specific process node or minimum length, however, and may be smaller or larger according to the desired operating speeds of the level shifter. The level shifter 400 includes amplitude control to prevent voltage overstress on the thin film transistors in its architecture, while meeting the voltage input requirements, e.g., 0.5 V target low output level and a 1.5 V target high output level, of the circuit that receives the level shifted signals.

The level shifter 400 translates a differential full swing CMOS input signal ("In" and "In_bar") to levels compatible with a selected logic convention, e.g., from CMOS to CML.

The level shifter 400 includes a supply input 402 that provides a target high output level (e.g., 1.5 V). A signal input 404, 406 carries the differential input signal, In and In_bar. A differential signal output 408, 410 carries a differential output signal, Out and Out_bar.

In FIG. 4, level translation circuitry 412 is configured to translate the input signal to shifted levels compatible with the logic domain that will receive the translated signals. Each transistor in the translation circuitry may be a thin film transistor. The level shifter 400 also includes level translation circuitry 413 for the complementary side of the level shifter 400. The level translation circuitry 413 may be implemented in the same manner as described below for the level translation circuitry 412. For example, the level translation circuitry 412 may translate CMOS level input signals characterized by a nominal high level (e.g., 1.0 V) and a nominal low level (e.g., 0.0 V) to a shifted high level (e.g., 1.5 V) and to a shifted low level (e.g., 0.5 V) compatible with CML logic.

In one implementation, the level translation circuitry 412 includes an amplitude control circuit 414 connected to the supply input 402 and the signal output 408. The level translation circuitry 412 also includes an overvoltage protection circuit 416 in series with the amplitude control circuit 414. In addition, a switching circuit 418 is present in series with the overvoltage protection circuit 416 and connected to the signal input 404.

In the example shown in FIG. 1, the amplitude control circuit 414 includes a PMOS amplitude control transistor 420. The overvoltage protection circuit 416 comprises a cascode connected transistor 422 in series with the amplitude control circuit 414 and the switching circuit 418. The switching circuit 418 includes an NMOS switching transistor 424 responsive to the input signal to facilitate driving the output signal toward its desired state, in conjunction with the cross coupled output-feedback switching transistors 430 and 432. Each of the transistors in the level translation circuitry may be a thin oxide transistor that facilitates very fast operation in comparison with thick oxide devices.

The physical construction of the transistors gives rise to voltage stress rules for the transistors. The voltage stress rules impact the reliability and life span of the chip that includes the transistors. Compliance with the voltage stress rules prevents damage to the transistors. With thin oxide devices, the voltage stress rules may specify lower limits on stress parameters such as gate-to-drain voltage and gate-to-source voltage than for thick oxide devices. For example, the voltage stress rules for the thin oxide transistors may be: Vgd<1.05 V and Vgs<1.05 V. However, the level shifter may be configured to meet other voltage stress rules.

The overvoltage protection circuit 416 is configured to keep voltage stress on the switching circuit 418 compliant with voltage stress rules. For example, the cascode connected transistor 422 may ensure that voltage at point 434 remains below about 1.0 V, and therefore Vgd and Vgs of the switching transistor 424 remain <1.05 V. The cascode connected transistor 422 prevents the voltage at point 434 from rising above approximately Vb in the worst case, and nominally about Vb-Vt in the usual case. In one implementation, the cascode gate voltage, Vb, is maintained at about 1.0 V, thereby limiting Vgd for the switching transistor 424 to 1.0 V or less. The overvoltage protection circuit 416 prevents the switching transistor 424 from seeing more than the allowable amount of voltage stress, given the higher supply voltage of 1.5 V. In that respect, the overvoltage protection circuit isolates the switching transistor 424 from the higher supply voltage, particularly when the gate of the switching transistor 424 is at 0 V.

To further enhance operational speed, the level translation circuitry 412, 413 may further include a current bleed circuit 426 connected to the overvoltage protection circuit 416. The current bleed circuit 426 is configured to drain current from the overvoltage protection circuit 416 to help ensure fast operation of the overvoltage protection circuit 416. In one implementation, the current bleed circuit 426 prevents the cascode connected transistor 422 from completely turning off by allowing a current to flow through the cascode connected transistor 422. The current may be very small (e.g., 50 μA), and essentially negligible from an energy consumption standpoint.

In one implementation, the current bleed circuit 426 is implemented with a diode-connected transistor 428. The diode-connected transistor 428 may act as a large resistance, with the transistor fabrication taking only a very small space in the layout. For example, the diode-connected transistor 428 may have a long channel length and a narrow width. As a specific example, the diode connected-transistor 428 may be 2 times to 3 times the minimum geometry length, and have a width that is the minimum geometry width. Many variations of width and length are suitable however, to allow some current to continue to flow through the cascode connected transistor 422.

Regarding amplitude control, note that the amplitude control transistor 420 has a gate connected to an amplitude-control gate voltage that regulates the operation of the amplitude control transistor 420. In particular, the voltage on the gate is controlled by a feedback loop that includes a voltage control circuit. The feedback loop is described in detail below with regard to FIG. 5.

Figure 5:
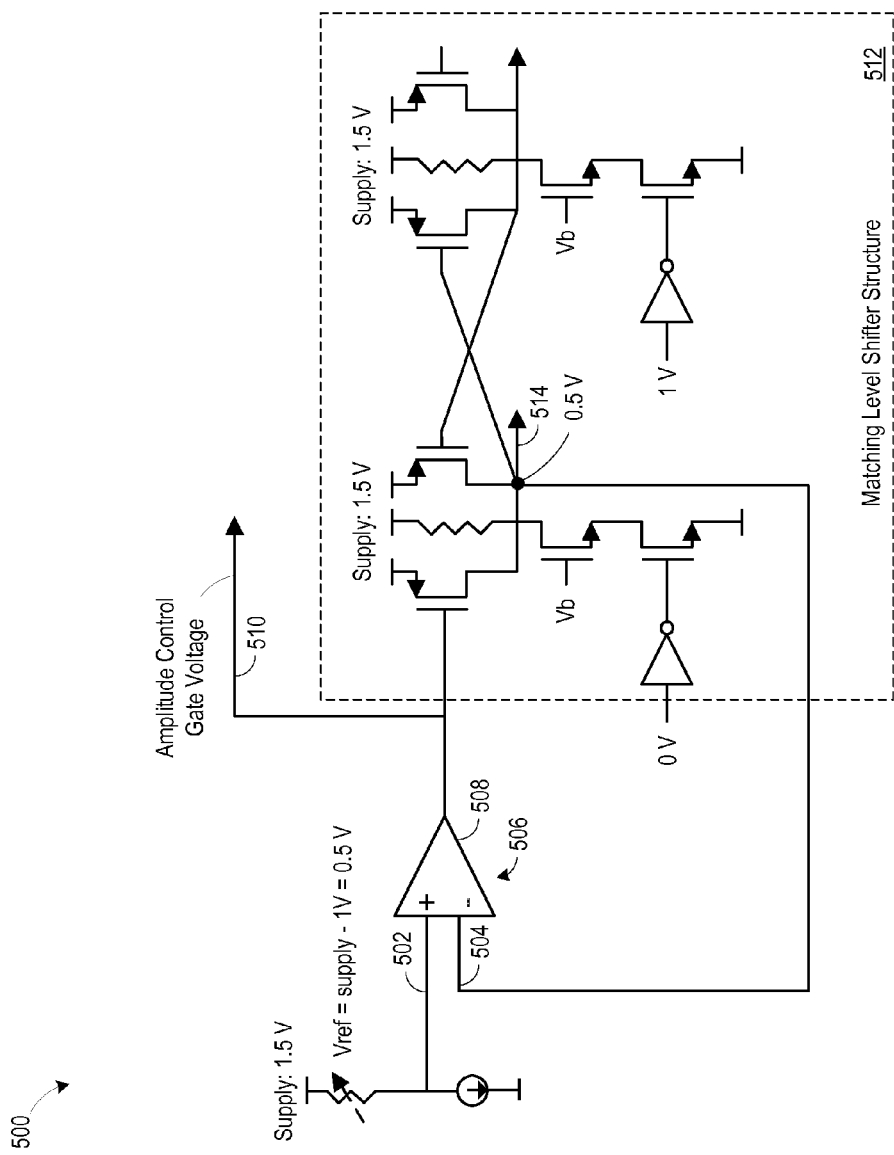
FIG. 5 shows an example of a feedback loop for amplitude control that controls voltage swing to ensure compliance with voltage overstress rules.

FIG. 5 shows one example implementation of a feedback loop 500 for amplitude control. The feedback loop 500 includes a reference voltage input 502 and a feedback voltage input 504 connected to the signal output 514. The reference voltage input 502 may be derived from any voltage supply, such as the 1.5 V system voltage supply. The feedback loop 500 further includes a voltage control circuit 506 responsive to the reference voltage input 502 in comparison to the feedback voltage input 504. In the example of FIG. 5, the voltage control circuit is implemented as a difference amplifier, specifically an operational amplifier 508 that generates the amplitude control gate voltage 510. The amplitude control gate voltage 510 drives the gate of each amplitude control transistor 420.

Note that a matching level shifter structure 512 provides the signal output 514. The matching level shifter structure 512 provides a reference structure to the individual level shifters (e.g., instances of the level shifter 400) operating in the circuit. In one respect, the matching level shifter structure 512 may be expected to vary over process, voltage, temperature (PVT) and other variables in the same way as the transistors in the individual level shifters. The matching level shifter structure 512 may be driven with static inputs (e.g., In=0 V, In_bar=1 V) so that the signal output 514 provides a fixed reference voltage for the feedback voltage input 504.

Referring again to FIG. 4, note that the ratio of the resistance of the pullup resistor 436 and the on-resistance of the switching transistor 424 keeps the low output voltage nominally to about 0.5 V. This may vary over PVT, however, and it may fall below 0.5 V in some cases. Accordingly, the feedback loop 500 keeps the low output at 0.5 V or above. To that end, the voltage control circuit 506 drives the amplitude control transistor 420 to pull up the output voltage, to maintain the output voltage at the reference (e.g., 0.5 V) or above. As a result, the differential outputs, Out and Out_bar do not fall below 0.5 V, thereby protecting the switching transistor 424 from potentially damaging voltage stress.

The pullup resistor 436 may perform the majority of the pullup to 1.5 V. The pullup resistor 436 provides a low capacitance route for the output of the level shifter to quickly transition to the high output level of 1.5 V. The two PFETs 420 and 430 also contribute to the pullup, though the impedance of the pullup resistor 436 is typically much smaller than that of the PFETs. When driving to the low output, e.g., 0.5 V, the switching transistor 424 is on, and presents a resistance about ⅓ of that of the pullup resistor 436. For example, the pullup resistor 436 may be a 1K Ohm resistor, and the switching transistor may be fabricated to present an Rds-on of about 500 Ohms. For lower speed switching, the pullup resistor 436 value may be increased (leading to lower current dissipation).

Returning to FIG. 5, the reference voltage input 502 is set to 0.5 V. Accordingly, the voltage control circuit 506 attempts to maintain the signal output at no less than 0.5 V by regulating the amplitude control transistors 420 so that the output voltage does not fall below 0.5 V. Thus, in one aspect, the voltage control circuit 506 maintains the shifted low level from falling below a preselected voltage reference (e.g., 0.5 V). Note that when the level translation circuitry 412 is driving a high output level, 1.5 V, the voltage control circuit 506 is still active. However, with the switching transistor 424 off, the pullup resistor 436 and cross coupled feedback switching transistor 430 are already driving the signal output 408 to 1.5 V regardless of the operation of the voltage control circuit 506. The cross coupled feedback switching transistor 430 is off when the level translation circuitry 412 is driving a low level output, logic '0' and in the case, the amplitude control transistor 420 may add to the low level output under control of the feedback loop 500.

The level shifter 400 may be described and implemented in many different ways. Expressed another way, the level shifter circuitry includes a supply input, a signal input configured to carry an input signal characterized by a first convention high level and a first convention low level, and a signal output configured to carry an output signal. In addition, level translation circuitry is configured to translate the input signal to a shifted high level and a shifted low level compatible with a second convention for the output signal.

The level translation circuitry may include an amplitude control transistor connected between the supply input and the signal output, an overvoltage protection transistor in series with the amplitude control transistor, and a switching transistor in series with the overvoltage protection circuit. The switching transistor is connected to the signal input. In addition, a voltage control circuit is present and is configured to regulate the amplitude control transistor to prevent the shifted low level from falling below a preselected voltage.

In one implementation, the voltage control circuit includes a reference voltage input set to the preselected voltage, a feedback voltage input connected to the signal output, and a difference amplifier. The difference amplifier is connected to the reference voltage input and the feedback voltage input. Further, the difference amplifier is configured to regulate the amplitude control transistor responsive to a difference between the reference voltage input and the feedback voltage input. Several examples of the level shifter have been given, and it is noted that other implementations are possible. In other implementations, the difference amplifier may instead be an error amplifier, or other type of feedback circuit that attempts to drive the feedback voltage input to a specified reference voltage.

What is claimed is:

1. A circuit comprising:
 a supply input configured to provide a target high output level;
 a signal input configured to carry an input signal;
 a signal output configured to carry an output signal; and
 level translation circuitry configured to generate the output signal by shifting the input signal between a target low output level and the target high output level, the level translation circuitry comprising:
   an amplitude control circuit coupled to the supply input and the signal output;
   an overvoltage protection circuit in series with the amplitude control circuit;
   a current bleed circuit coupled to the overvoltage protection circuit, the current bleed circuit configured to drain current from the overvoltage protection circuit; and
   a switching circuit in series with the overvoltage protection circuit and coupled to the signal input.

2. The circuit of claim 1, where:
 the amplitude control circuit comprises an amplitude control transistor.

3. The circuit of claim 1, where:
 the overvoltage protection circuit comprises a cascode coupled transistor in series with the amplitude control circuit and the switching circuit.

4. The circuit of claim 1, where:
 the amplitude control circuit comprises an amplitude control transistor;
 the amplitude control transistor comprises a gate; and where:
 the gate is coupled to an amplitude control gate voltage.

5. The circuit of claim 4, further comprising:
 a feedback loop configured to provide the amplitude control gate voltage.

6. The circuit of claim 5, where the feedback loop comprises:
 a reference voltage input;
 a feedback voltage input coupled to the signal output; and
 a voltage control circuit configured to generate the amplitude control gate voltage responsive to the reference voltage input in comparison to the feedback voltage input.

7. The circuit of claim 1, where:
 the overvoltage protection circuit comprises a cascode coupled transistor in series with the amplitude control circuit and the switching circuit.

8. The circuit of claim 7, where the current bleed circuit is configured to prevent the cascode coupled transistor from completely turning off.

9. The circuit of claim 8, where the current bleed circuit comprises a diode coupled transistor.

10. The circuit of claim 7, where the current bleed circuit is configured to allow a current to flow through the cascode coupled transistor.

11. The circuit of claim 7, further comprising a voltage control circuit configured to regulate the amplitude control circuit to prevent the target low level from falling below a preselected voltage.

12. A circuit comprising:
 a signal input configured to carry an input signal characterized by a nominal high level and a nominal low level;
 a signal output configured to carry an output signal;
 level translation circuitry in communication with the signal input and the signal output and configured to translate the input signal to a shifted high level and a shifted low level in the output signal; and a voltage control circuit comprising:
   a feedback input configured to receive the signal output; and
   a comparison circuit configured to:
      compare the signal output to a preselected reference voltage; and
      responsive to the comparison, prevent the shifted low level from falling below the preselected reference voltage.

13. The circuit of claim 12, further comprising:
a switching circuit coupled to the signal input; and
an overvoltage protection circuit in series with the switching circuit.

14. The circuit of claim 13, where:
the switching circuit is characterized by a voltage stress rule; and
the overvoltage protection circuit is configured keep voltage stress on the switching circuit compliant with the voltage stress rule.

15. The circuit of claim 14, where the voltage stress rule comprises a gate-to-drain voltage limit, a gate-to-source voltage limit, or both.

16. The circuit of claim 12, further comprising:
an amplitude control circuit regulated by the voltage control circuit.

17. The circuit of claim 16, where the amplitude control circuit comprises a transistor with a gate regulated by the voltage control circuit.

18. The circuit of claim 12, where the comparison circuit comprises an error amplifier configured to drive the signal output at the feedback input to the preselected reference voltage.

19. A circuit comprising:
a supply input;
a signal input configured to carry an input signal characterized by a first convention high level and a first convention low level;
a signal output configured to carry an output signal;
level translation circuitry configured to translate the input signal between a shifted high level and a shifted low level compatible with a second convention in the output signal,
the level translation circuitry comprising:
   an amplitude control transistor coupled between the supply input and the signal output;
   an overvoltage protection transistor in series with the amplitude control transistor;
   a current bleed circuit coupled to the overvoltage protection transistor, the current bleed circuit configured to prevent the overvoltage protection transistor from fully turning off; and
   a switching transistor in series with the overvoltage protection transistor, the switching transistor coupled to the signal input; and
a voltage control circuit configured to regulate the amplitude control transistor to prevent the shifted low level from falling below a preselected voltage.

20. The circuit of claim 19, where the voltage control circuit comprises:
a reference voltage input set to the preselected voltage;
a feedback voltage input coupled to the signal output; and
a difference amplifier coupled to the reference voltage input and the feedback voltage input,
where the difference amplifier is configured to regulate the amplitude control transistor responsive to a difference between the reference voltage input and the feedback voltage input.

* * * * *

UNITED STATES PATENT AND TRADEMARK OFFICE
CERTIFICATE OF CORRECTION

| | |
|---|---|
| PATENT NO. | : 9,197,214 B2 |
| APPLICATION NO. | : 14/025058 |
| DATED | : November 24, 2015 |
| INVENTOR(S) | : Ali Nazemi et al. |

It is certified that error appears in the above-identified patent and that said Letters Patent is hereby corrected as shown below:

In the Claims

In column 6, claim 9, line 54, after "comprises a" replace "diode coupled" with --diode-coupled--.

Signed and Sealed this
Twelfth Day of July, 2016

Michelle K. Lee
*Director of the United States Patent and Trademark Office*